(12) United States Patent
Hwang et al.

(10) Patent No.: US 7,479,458 B1
(45) Date of Patent: Jan. 20, 2009

(54) METHODS AND APPARATUS FOR THE OPTIMIZATION OF HIGHLY SELECTIVE PROCESS GASES

(75) Inventors: Guang-Yaw Hwang, Hsin-Shi (TW); Thomas Nguyen, Fremont, CA (US); Wen-Ben Chou, Fremont, CA (US); Timothy Tran, Fremont, CA (US); Yu-Wei Yang, Hsin-Shi (TW)

(73) Assignee: Lam Research Corporation, Fremont, CA (US)

( * ) Notice: Subject to any disclaimer, the term of this patent is extended or adjusted under 35 U.S.C. 154(b) by 144 days.

(21) Appl. No.: 11/305,369

(22) Filed: Dec. 15, 2005

(51) Int. Cl.
*H01L 21/302* (2006.01)

(52) U.S. Cl. .................. 438/714; 438/725; 438/740; 216/67

(58) Field of Classification Search .............. 438/714, 438/725, 740; 156/345.41, 345.32, 345.48, 156/345.33; 216/67
See application file for complete search history.

(56) References Cited

U.S. PATENT DOCUMENTS 6,670,278 B2 * 12/2003 Li et al. ................. 438/710
6,962,879 B2 * 11/2005 Zhu et al. ................. 438/724
2005/0079725 A1 * 4/2005 Zhu et al. ................. 438/710

OTHER PUBLICATIONS

J.J. Wang et al., "Low Bias Etching of SiC and SiCN in ICP NF3 Discharges", pp. 1-6; 1998.
Michael R. Oliver, "Integration Issues with Cu CMP", Dec. 3, 2003, Rodel, Inc., pp. 1-27.
Kastenmeier, et al., "Porus Low-K Materials and Effective K", Jul. 1, 2004, pp. 1-6, http://www.reed-electronics.com/semiconductor/index.asp?layout=articl . . . .

* cited by examiner

*Primary Examiner*—George A. Goudreau
(74) *Attorney, Agent, or Firm*—IP Strategy Group, P.C.

(57) ABSTRACT

A method for etching a barrier material on a semiconductor substrate is disclosed. The method includes placing the substrate in a plasma processing chamber of the plasma processing system, wherein the substrate includes the barrier material and a low-k material, and wherein the barrier material and a low-k material are configured to be exposed to a plasma. The method also includes flowing an etchant gas mixture, including $CH_3F$ from about 4% to about 8% of a plasma gas flow, into the plasma processing chamber, wherein the etchant gas mixture is configured to etch the barrier material at a first etch rate, the etchant gas mixture is configured to etch the low-k material at a second etch rate, wherein the first etch rate is substantially greater than the second etch rate. The method further includes striking a plasma from the etchant source gas; and etching the barrier layer and the low-k layer.

16 Claims, 10 Drawing Sheets

METHODS AND APPARATUS FOR THE OPTIMIZATION OF HIGHLY SELECTIVE PROCESS GASES

BACKGROUND OF THE INVENTION

The present invention relates in general to substrate manufacturing technologies and in particular to methods and apparatus for the optimization of highly selective process gases in order to etch a barrier layer.

In the processing of a substrate, e.g., a semiconductor substrate or a glass panel such as one used in flat panel display manufacturing, plasma is often employed. As part of the processing of a substrate for example, the substrate is divided into a plurality of dies, or rectangular areas, each of which will become an integrated circuit. The substrate is then processed in a series of steps in which materials are selectively removed (etching) and deposited (deposition) in order to form electrical components thereon.

In an exemplary plasma process, a substrate is coated with a thin film of hardened emulsion (i.e., such as a photoresist mask) prior to etching. Areas of the hardened emulsion are then selectively removed, causing components of the underlying layer to become exposed. The substrate is then placed in a plasma processing chamber on a substrate support structure comprising a mono-polar or bi-polar electrode, called a chuck or pedestal. Appropriate etchant source are then flowed into the chamber and struck to form a plasma to etch exposed areas of the substrate.

FIG. 1 depicts a plasma processing system 150 including a chamber 100 equipped with a pump 120 to maintain a low chamber pressure and exhaust the process gas effluent. Chamber 100 is grounded as is the upper electrode 104 that also acts as a showerhead type gas distribution system. RF power is supplied from power source 101 to an electrostatic chuck (chuck) 108 situated on a lower electrode assembly 106. RF power source may include a means for matching to the plasma impedance by frequency tuning or by tuning a variable impedance in matching network 145. Plasma 102 is generated by supplying RF power to chuck 108 in order to process substrate 109. In this example system, plasma 102 is confined between chuck 108 and electrode 104 by means of confinement rings 103, which may control a pressure within plasma 102. Confinement rings 103 can be moved to increase and decrease a spacing or gap between adjacent confinement rings, commonly by the use of cam ring. Gas distribution system 122 is commonly comprised of compressed gas cylinders containing plasma processing gases (e.g., $C_4F_8$, $C_4F_6$, $CHF_3$, $CH_3F$, $CF_4$, $HBr$, $CH_3F$, $C_2F_4$, $N_2$, $O_2$, Ar, Xe, He, $H_2$, $NH_3$, $SF_6$, $BCl_3$, $Cl_2$, $WF_6$, etc).

Generally, some type of cooling system is coupled to the chuck in order to achieve thermal equilibrium once the plasma is ignited. The cooling system itself is usually comprised of a chiller that pumps a coolant through cavities in within the chuck, and helium gas pressurizes the small gap between the chuck and the substrate. In addition to removing the generated heat, the helium gas also allows the cooling system to rapidly control heat dissipation. That is, increasing helium pressure subsequently also increases the heat transfer rate. Most plasma processing systems are also controlled by sophisticated computers comprising operating software programs. In a typical operating environment, manufacturing process parameters (e.g., voltage, gas flow mix, gas flow rate, pressure, etc.) are generally configured for a particular plasma processing system and a specific recipe.

In a common substrate manufacturing method, known as dual damascene, dielectric layers are electrically connected by a conductive plug filling a via hole. Generally, an opening is formed in a dielectric layer, usually lined with a barrier material (e.g. SiCN, SiC, SiON, $Si_3N_4$, etc.), and then subsequently filled with a conductive material (e.g., aluminum (Al), copper (Cu), etc.) that allows electrical contact between two sets of conductive patterns. This establishes electrical contact between two active regions on the substrate, such as a source/drain region. Excess conductive material on the surface of the dielectric layer is typically removed by chemical mechanical polishing (CMP). A blanket layer of barrier dielectric film (e.g., silicon nitride, SiC, or SiCN) is then deposited to cap the copper.

There are generally two commonly used approaches for manufacturing dual damascene substrate: via-first and trench-first. In one example of the via-first methodology, the substrate is first coated with photoresist and then the vias are lithographically patterned. Next, an anisotropic etch cuts through the surface cap material and etches down through the low-k layer of the substrate, and stops on the barrier material, just above the underlying metal layer. Next, the via photoresist layer is stripped, and the trench photoresist is applied and lithographically patterned. Typically, some of the photoresist will remain in the bottom of the via, or the via may be covered by an organic ARC plug, in order to prevent the lower portion via from being over-etched during the trench etch process. A second anisotropic etch then cuts through the surface cap material and etches the low-k material down to a desired depth. This etch forms the trench. The photoresist is then stripped and the barrier material at the bottom of the via is opened with a very soft, low-energy power etch that will not cause the underlying copper to sputter into the via sidewall or to minimize copper surface damage. As described above, the trench and via are filled with a conductive material (e.g., aluminum (Al), Copper (Cu), etc.) and polished by chemical mechanical polishing (CMP).

An alternate methodology is trench-first. In one example, the substrate is coated with photoresist and a trench lithographic pattern is applied. An anisotropic dry etch then cuts through the surface hard mask (e.g., SiCN, SiC, SiON, $Si_3N_4$, etc.) followed by stripping the photoresist. Another photoresist is applied over the trench hard mask and then the vias are lithographically patterned. A second anisotropic etch then cuts through cap layer and partially etches down into the low-k material. This etch forms the partial vias. The photoresist is then stripped for trench etch over the vias with the hard mask. The trench etch then cuts through the cap layer and partially etches the low-k material down to desired depth. This etch also clears via holes at the same time stopping on the final barrier material located at the bottom of the via. The final barrier material may then be opened with a special etch.

To facilitate discussion, FIG. 2A illustrates an idealized cross-sectional view of the layer stack, representing the layers of an exemplar substrate, prior to a lithographic step. In the discussions that follow, terms such as "above" and "below," which may be employed herein to discuss the spatial relationship among the layers, may, but need not always, denote a direct contact between the layers involved. It should be noted that other additional layers above, below, or between the layers shown may be present. Further, not all of the shown layers need necessarily be present and some or all may be substituted by other different layers.

At the bottom of the layer stack, there is shown a layer 208, comprising a dielectric film above the contacts and semiconductor gates. Above layer 208 is deposited a barrier layer 204 (e.g. SiCN, SiC, SiON, $Si_3N_4$, etc.). Dual damascene substrates further comprise a set of metal layers including M1 209a-b, typically comprising aluminum or copper. Above the barrier layer 204, is deposited an intermediate dielectric (IMD) layer 206, comprising a low-k material (e.g., SiOC, black diamond, coral, etc.). Above the IMD layer 206, there may be placed a cap layer 203, typically comprising SiCN, SiC, or SiO$_2$. Above cap layer 203, there may be disposed a trench mask layer 202, typically comprising TiN, SiN, or TaN.

Examples of CVD Organosilicate Glass (OSG) low-k material include:

| Supplier | Name | k value |
| --- | --- | --- |
| Applied Materials | Black Diamond ™ | 3.1-2.4 |
| Novellus Systems | CORAL ™ | 2.85-2.2 |
| Trikon Technologies | Flowfill ™ (non-porous) | 2.8 |
|  | ORION ™ (porous) | 2.2 |
| ASM | Aurora | <3.0 |
| Dow Corning | SiCOH | 2.7 |

Examples of Spin-On Dielectric (SOD) low-k material include:

| Supplier | Name | k value |
| --- | --- | --- |
| Shipley | Zirkon | 2.25 |
| Dow Chemical | SiLK (non-porous) | 2.65 |
|  | p-SiLK (porous) | <2.4 |
| JSR | LKD-5109 (porous) | 2.2 |
| Honeywell | Nanoglass (porous) | 2.2-1.9 |

FIG. 2B shows a somewhat idealized cross-sectional view of the layer stack of FIG. 2A, after photoresist layer 220 and a BARC layer 212 is further added.

FIG. 2C shows a somewhat idealized cross-sectional view of the layer stack of FIG. 2B after photoresist layer 220 and etched BARC layer 212 have been processed through lithography and plasma etch respectively. In this example, a photoresist mask pattern is created with a set of trenches 214a-b.

FIG. 2D shows the cross-sectional view of the layer stack of FIG. 2C after trench mask layer 201 has been processed in the plasma system, further extending trench 214a-b to cap layer 203.

FIG. 2E shows the cross-sectional view of the layer stack of FIG. 2D, after photoresist layer 220 and a BARC layer 212 are removed.

FIG. 2F shows the cross-sectional view of the layer stack of FIG. 2E after a second photoresist layer 216 and a BARC layer 218 are disposed, in order to create a second metal layer and a via connecting it to the first metal layer 209a-b.

FIG. 2G shows the cross-sectional view of the layer stack of FIG. 2F after the photoresist mask and BARC layers have been opened and an etch has been performed to partially etch into IMD layer 206 to create a via.

FIG. 2H shows the cross-sectional view of the layer stack of FIG. 2G after photoresist layer 216 and BARC layer 218 have been stripped, and an additional etch process has been performed to extend the trench to a desired depth and etch through a via stopping on barrier layer 204.

In FIG. 2I, the barrier layer 204 is etched through using, for example CH$_2$F$_2$, CH$_3$F, etc.

In FIG. 2J, a chemical mechanical polish process has been performed to polish the layer stack down to cap layer 203, and a conductive material (e.g., aluminum (Al), Copper (Cu), etc.) has been deposited to contact the existing M1 metal material.

In general, as substrate interconnect dimensions continue to shrink, on-chip resistance-capacitance (RC) time delays become the major limitation in achieving faster circuit speeds. In order to reduce the time delays, low dielectric constant materials are commonly used. However, materials with low dielectric constants may also be susceptible to chemical modifications in aggressive environments, such as during etch and resist strip.

Consequently, determining when to stop the process (endpoint) may be critical. Endpoint generally refers to a set of values, or a range, in a plasma process (e.g., time) for which a process is considered complete. For example, when etching a via, it is important to determine when a barrier layer (e.g, SiCN, SiC, SiON, Si$_3$N$_4$, etc.) has been substantially penetrated, in order minimize the amount of etching into the underlying layer.

However, with these and other plasma processes, it is often difficult to monitor the process since process conditions may be dynamic within a plasma processing system because of chamber residue build up, plasma damage to chamber structures, etc. In general, etchants used to etch the barrier layer do not have a high selectivity to the exposed low-k layer, and hence may substantially damage the low-k layer if not stopped and the appropriate time. Selectivity is generally the ratio of the etch rates between different materials, particularly the material that needs to be etched compared with the material that should not be etched.

One common technique used in plasma processing systems is optical emission spectroscopy (OES). In OES, an optical emission from a set of selected chemical species (i.e., such as radicals, ions, etc.) in a plasma processing system may be correlated to a process threshold, such as endpoint. That is, each type of activated species within the plasma processing chamber generally possesses a unique spectral signature, usually corresponding to a unique set of electromagnetic radiation wavelengths (usually between about 245 nm to about 800 nm). By monitoring for the intensity of a specific wavelength not substantially produced by any other species or by the plasma process itself, a process threshold can be determined by observing a change in the relative amount of a specific species in the plasma chamber.

For example, when SiCN is etched with a CF-based etchant, an N species is generally produced with a specific wavelength of about 674 nm. Once substantially consumed, the corresponding wavelength of the produced species generally drops, signaling that the process has achieved endpoint.

However, current optical spectrometry endpoint detection methods tend to be sensitive to changes in the chamber conditions, and hence may be inaccurate. For example, if the proper endpoint is not determined, the process gas may substantially etch into and hence damage the low-k layer. In some instances these changes in the plasma optical emissions can be comparable to an expected change used to trigger an endpoint call, thus causing a false endpoint call to occur. In addition, since only a small fraction of the total surface area (generally less than about 1%) may actually produce a signal change at endpoint, the change may be difficult to detect in the presence of the background chamber OES signal. Furthermore, effective mission spectral analysis is also made more difficult by the escalating requirements for substrates with sub-micron via contacts and high aspect ratios.

A possible solution is to reduce the etch rate in order to minimize the potential damage to the low-k material, assuming that the particular optical spectrometry endpoint detection method used may still detect a measured endpoint that is reasonably close to the actual endpoint. However, as the etching process tends to have complex interrelationships between physical, chemical, and electrical parameters, reducing the etch rate may adversely affect other aspects of the plasma process. For example, as etch rate slowed, feature profiles may be distorted, or mask undercut or roughness may be aggravated.

Referring now to FIG. 3, a simplified view of an etch process is shown. In general, a plasma etch process is substantially complex, and influenced by many factors. For example, an RF field creates several types species in plasma 310, such as high energy electrons, positive ions, negative ions, neutrals, and radicals. Positive ions are created when an electron is completely removed from a gas molecule or atom. Likewise, negative ions although rare, are created when an electron is added to a gas molecule or atom.

Radicals are created when electron collisions break up molecules into fragments which as a result have unsatisfied chemical bonding and are chemically reactive. Since they have no net charge, and therefore are not accelerated by the field or are not attracted by charged particles, they tend have a long lifetime compared to charged particles. Neutrals are stable, having neither a positive nor negative charge, nor are chemically active. Generally, two of the most important parameters are the number density and energy distribution of the electrons, which play a central role in initiating and maintaining the plasma.

In general, in a plasma etch process, directional etching is achieved by sidewall passivation, often through polymer formation 324 on the etch front. The amount of sidewall passivation depends on the amount of etch product and mask area, and it changes dramatically as one moves from isolated features to densely populated portions of the integrated circuit. The amount of sidewall passivation material determines the profile of the structure.

Some of the reactants in the plasma are transported to the substrate surface 302, where reaction 301 may occur, such as physi-sorption or chemisorption 304. In chemisorption, a strong "chemical bond" is formed between the adsorbed atom or molecule and the substrate. Physisorption is weaker, and is often being considered as having no chemical interaction involved.

Other reactants may then be transported to etch front 314, or deflected away if composed of ions 308. In combination with substrate temperature control 316 and bias created 318, these factors may subsequently affect profile 310 and surface quality 312. As previously described, ions are often used in etch reaction 320 to physically dislodged material from the substrate (e.g., oxide, etc.), while neutrals and radicals may be used in a etch reaction 320 to chemically remove material from the substrate. Reaction by-products often diffuse back into the main plasma gas stream and may be subsequently pumped 328 from plasma chamber 330.

Referring now to FIG. 4, a simplified diagram comparing selectivity to RF power in a plasma etch process is shown. All other plasma process characteristics held constant, in general, increasing RF power reduces the etch selectivity of barrier material to IMD film since the etch process tends to be more physical (i.e., sputtering) and less chemical. As previously described, selectivity is the ratio of the etch rates between the different materials, especially the material that needs to be etched compared with the material that should not be removed.

Referring now to FIG. 5, a simplified diagram comparing selectivity to pressure in a plasma etch process is shown. In contrast to FIG. 4, all other plasma process characteristics held constant, in general, increasing pressure tends to increase the etch selectivity of barrier material to IMD film, since the plasma, saturated with ions, has a smaller MFP.

Since fewer ions are available to reach the substrate surface, the etch process tends to be less physical and more chemical.

In view of the foregoing, there are desired methods and apparatus for the optimization of highly selective process gases in order to etch through a barrier layer across a large process window.

SUMMARY OF THE INVENTION

The invention relates, in one embodiment, in a plasma processing system, to a method for etching a barrier material on a semiconductor substrate. The method includes placing the substrate in a plasma processing chamber of the plasma processing system, wherein the substrate includes the barrier material and a low-k material, and wherein the barrier material and a low-k material are configured to be exposed to a plasma. The method also includes flowing an etchant gas mixture, including $CH_3F$ from about 4% to about 8% of a plasma gas flow, into the plasma processing chamber, wherein the etchant gas mixture is configured to etch the low-k material at a second etch rate, wherein the first etch rate is substantially greater than the second etch rate. The method further includes striking a plasma from the etchant source gas; and etching the barrier layer and the low-k layer.

The invention relates, in one embodiment, in a plasma processing system, to a method for etching through a barrier material on a semiconductor substrate. The method includes placing the substrate in a plasma processing chamber of the plasma processing system, wherein the substrate includes the barrier material and a low-k material, and wherein the barrier material and a low-k material are configured to be exposed to a plasma. The method also includes flowing an etchant gas mixture, including $CH_2F_2$ from about 1% to about 4% of a plasma gas flow, into the plasma processing chamber, wherein the etchant gas mixture is configured to etch the barrier material at a first etch rate, the etchant gas mixture is configured to etch the low-k material at a second etch rate, wherein the first etch rate is substantially greater than the second etch rate. The method further includes striking a plasma from the etchant source gas; and etching the barrier layer and the low-k layer.

The invention relates, in one embodiment, in a plasma processing system, to an apparatus for etching a barrier material on a semiconductor substrate. The apparatus includes means of placing the substrate in a plasma processing chamber of the plasma processing system, wherein the substrate includes the barrier material and a low-k material, and wherein the barrier material and a low-k material are configured to be exposed to a plasma. The apparatus also includes means of flowing an etchant gas mixture, including $CH_3F$ from about 4% to about 8% of a plasma gas flow, into the plasma processing chamber, wherein the etchant gas mixture is configured to etch the barrier material at a first etch rate, the etchant gas mixture is configured to etch the low-k material at a second etch rate, wherein the first etch rate is substantially greater than the second etch rate. The method further includes means of striking a plasma from the etchant source gas; and means of etching the barrier layer and the low-k layer.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
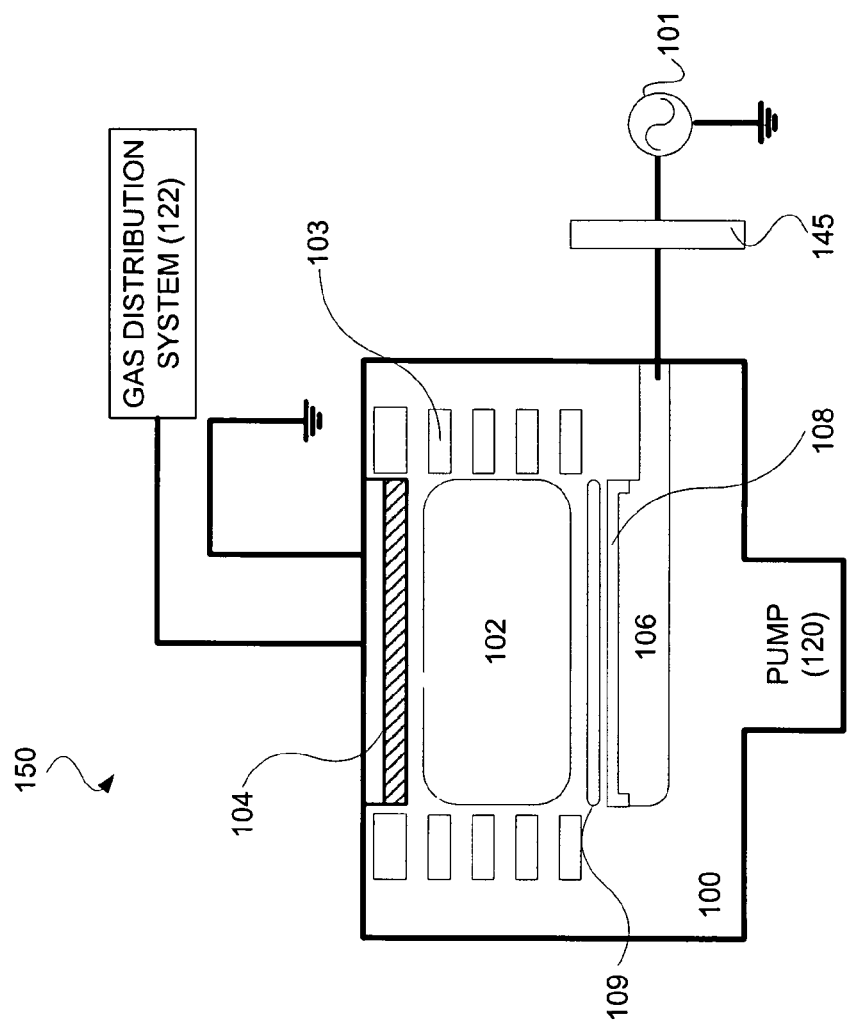
FIG. 1 shows a simplified diagram of a plasma processing system.
Figure 2A:
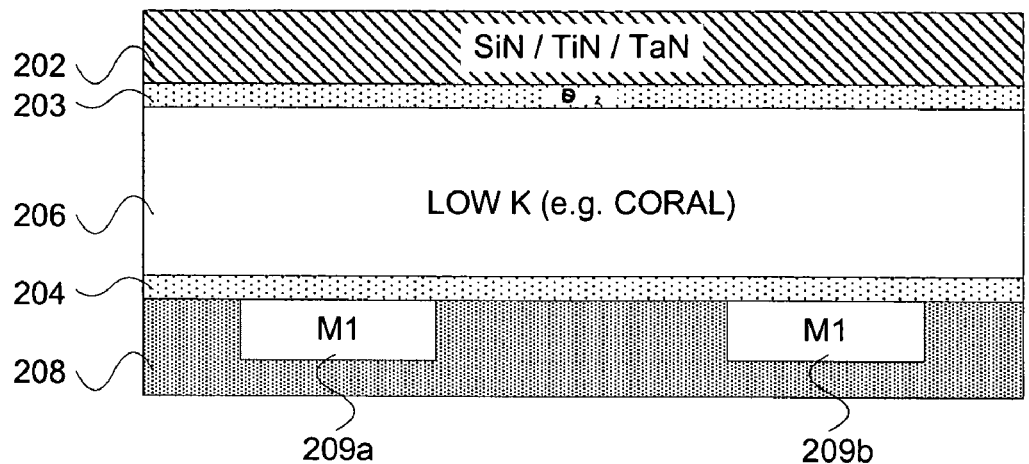
FIGS. 2A-J show an idealized cross-sectional view of the layer stack, representing the layers of an exemplar substrate.
Figure 2B:
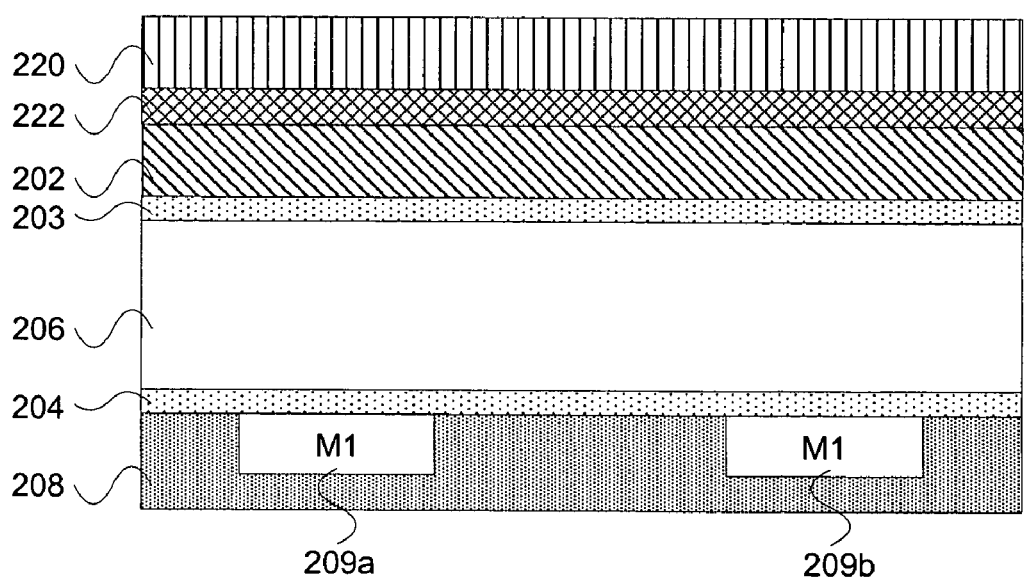
Figure 2C:
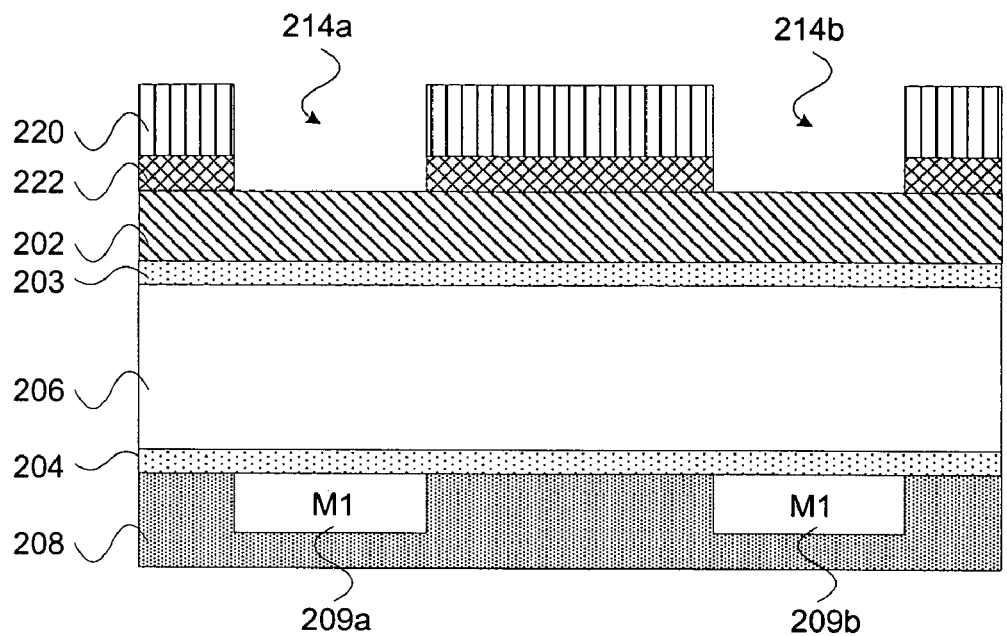
Figure 2D:
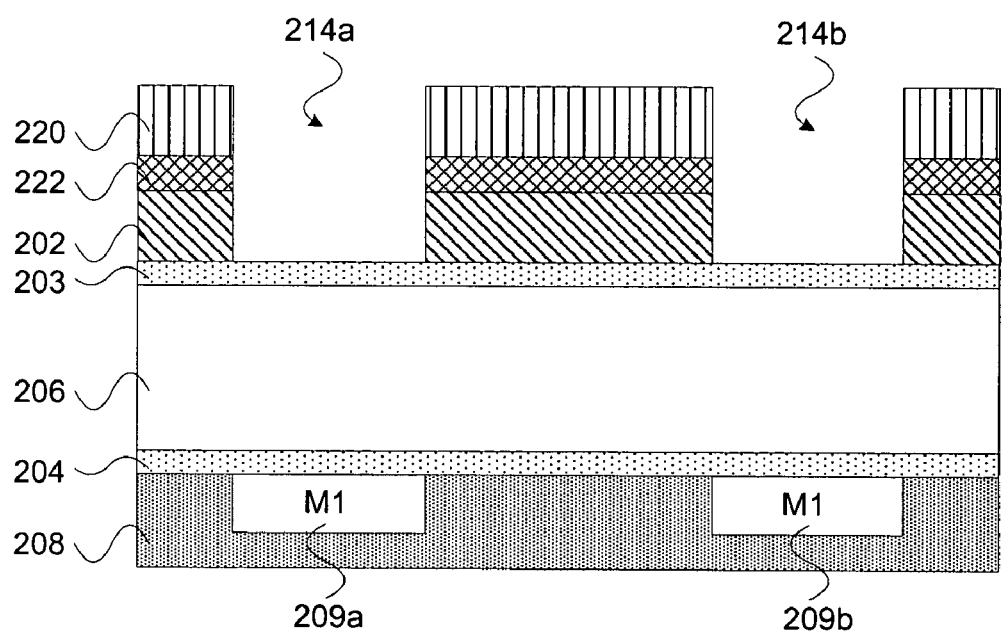
Figure 2E:
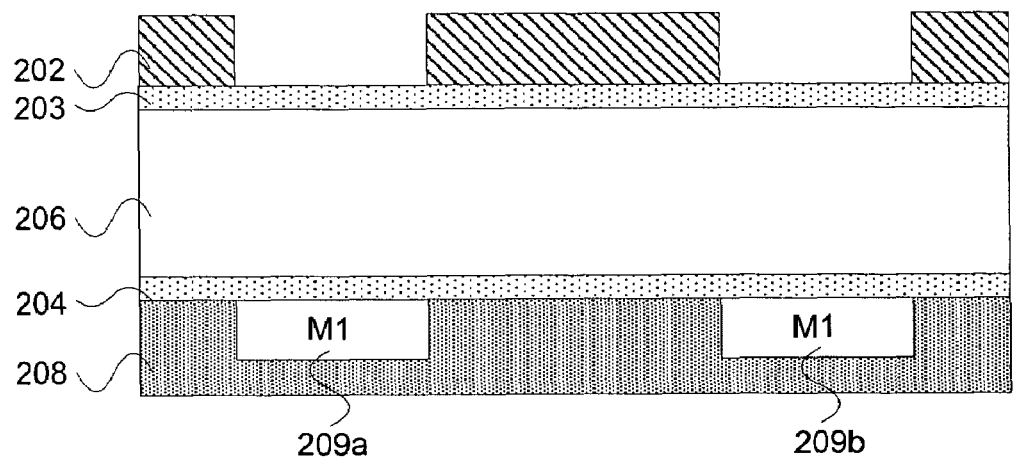
Figure 2F:
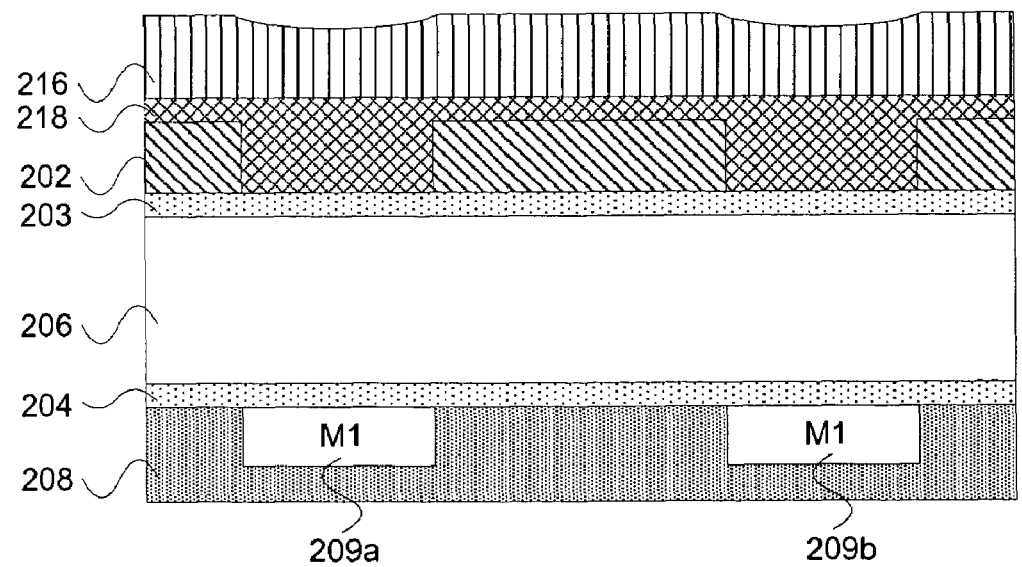
Figure 2G:
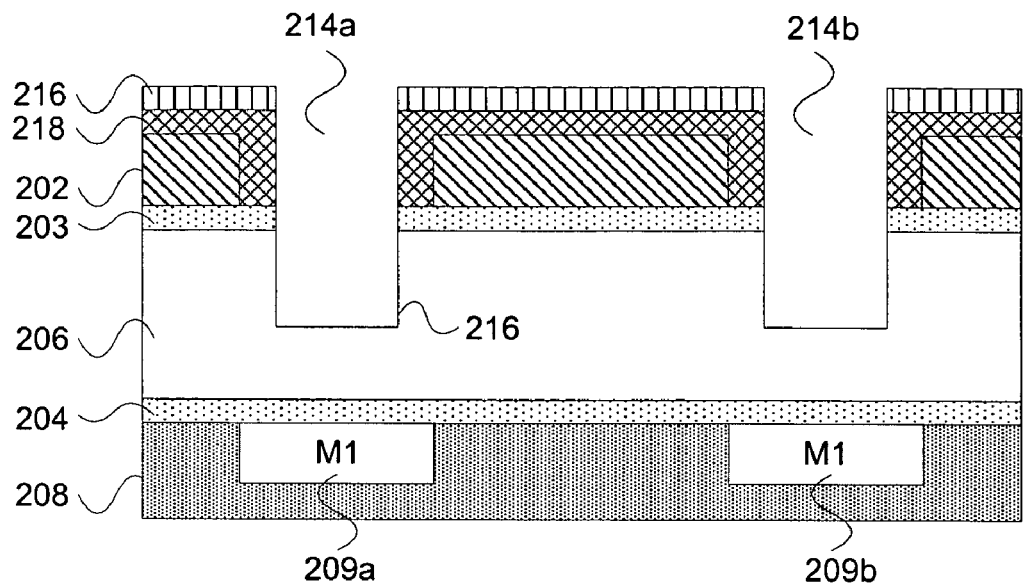
Figure 2H:
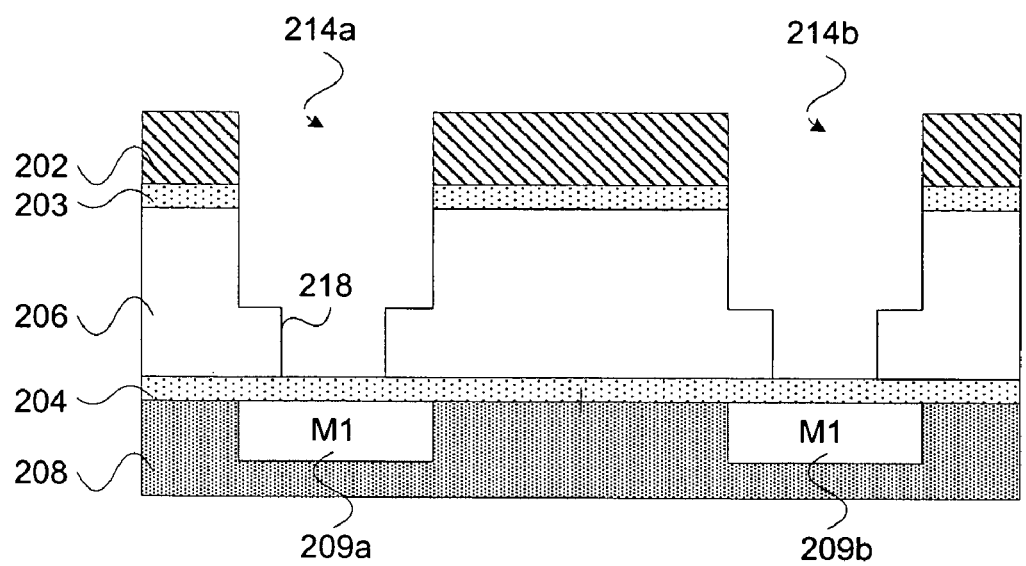
Figure 2I:
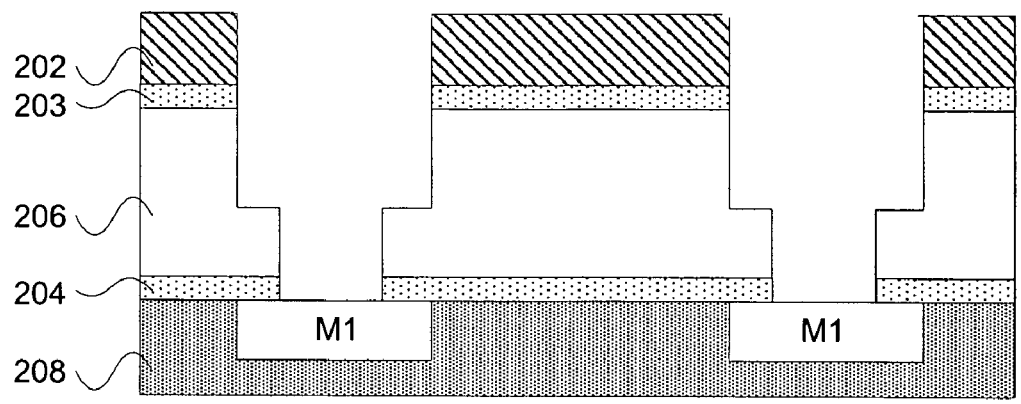
Figure 2J:
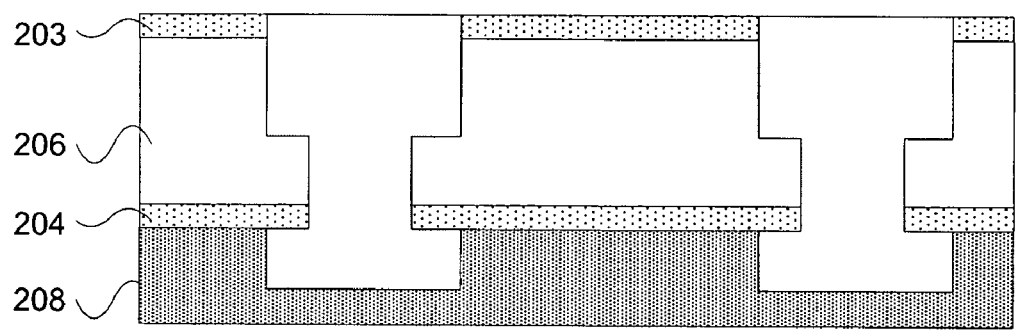
Figure 3:
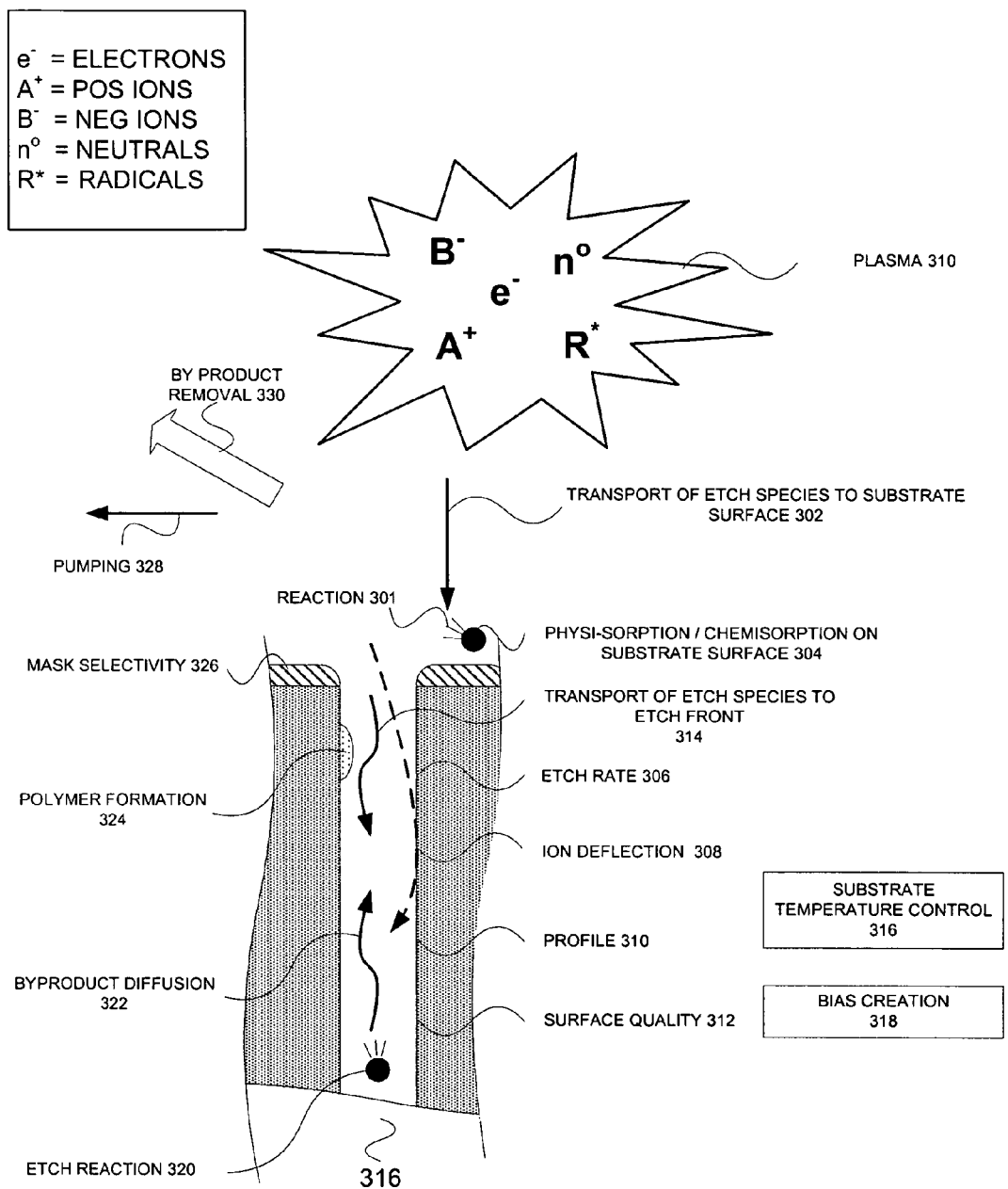
FIG. 3 shows a simplified view of a plasma etch process.
Figure 4:
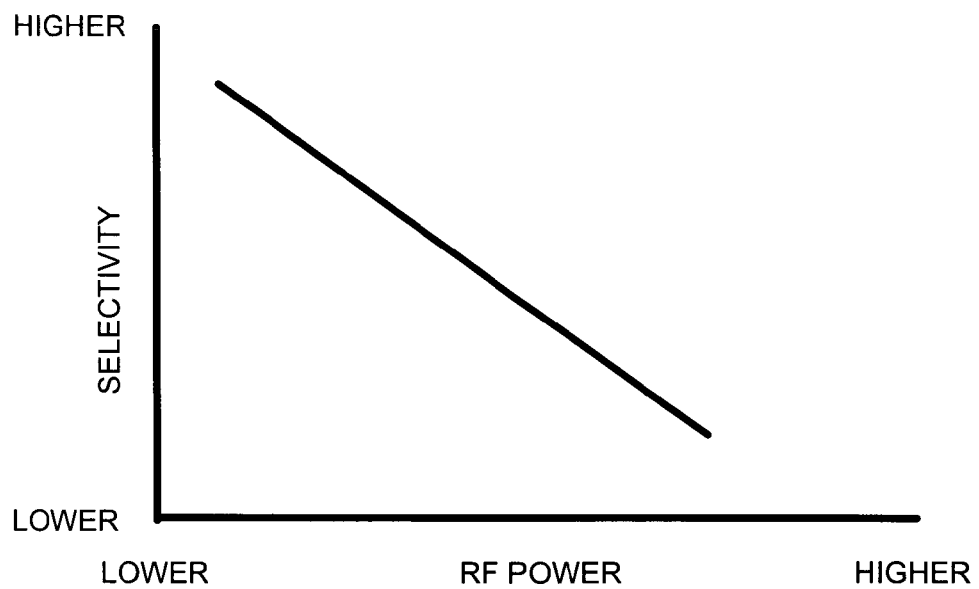
FIG. 4 shows a simplified diagram comparing selectivity to RF power in a plasma etch process.
Figure 5:
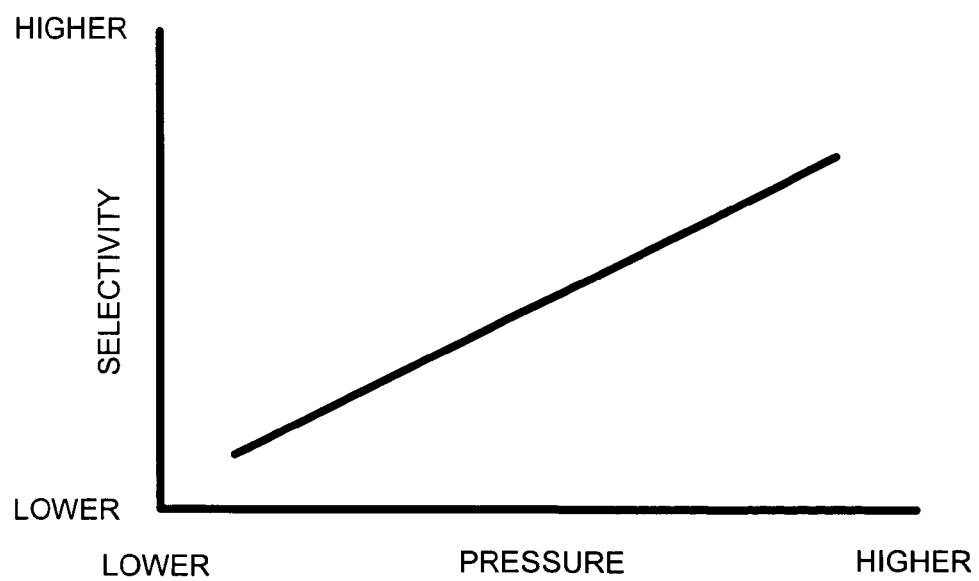
FIG. 5 shows a simplified diagram comparing selectivity to pressure in a plasma etch process.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

While not wishing to be bound by theory, it is believed by the inventors herein that process gases may be optimized in order to have a high selectivity of barrier to low-k material across a substantially large process window. As previously described, current optical spectrometry endpoint detection methods tend to be sensitive to changes in the chamber conditions, and hence may be inaccurate. However, through the use of a plasma gas that has a substantially high selectivity to low-k material, damage to the low-k layer may be substantially reduced. In an embodiment, the plasma gas comprises $CH_3F$. In an embodiment, the plasma gas comprises $CH_2F_2$. In an embodiment, the plasma gas comprises both $CHF_3$ and $CH_2F_2$. In an embodiment, the barrier material is SiCN. In an embodiment, the barrier material is SiC. In an embodiment, the barrier material is SiON. In an embodiment, the barrier material is $Si_3N_4$.

For example, a Lam Research 2300 Exelan Flex™ may be configured for etching a 300 mm substrate as described in FIGS. 2A-2J, with the following parameters

| Pressure: | about 40 to about 200 mTorr |
|---|---|
| Power Range: | about 200 W to about 1000 W |
| Argon: | about 0 sccm to about 600 sccm |
| $CF_4$: | about 10 sccm to about 200 sccm |
| $O_2$: | about 0 sccm to about 50 sccm |
| $CH_3F$: | about 5 sccm to about 50 sccm |
| CO: | about 50 sccm to about 500 sccm |
| Chuck Temperature: | about 0° to about 60° C. |

In an embodiment, $CH_3F$ preferably between about 5 sccm to about 50 sccm (about 8% to about 4% of the plasma gas flow) is substantially selective to low-k material. In an embodiment, $CH_3F$ more preferably between about 7% to about 5% of the plasma gas flow is substantially selective to low-k material. In an embodiment, $CH_3F$ most preferably at about 4% of the plasma gas flow is substantially selective to low-k material.

In an embodiment, $CH_2F_2$ preferably between about 0.6 sccm to about 50 sccm (about 1% to about 4% of the plasma gas flow) is substantially selective to low-k material. In an embodiment, $CH_2F_2$ more preferably between about 2% to about 3% of the plasma gas flow is substantially selective to low-k material. In an embodiment, $CH_2F_2$ most preferably selective at about 2.5% of the plasma gas flow is substantially selective to low-k material.

In an embodiment, $CH_3F$ preferably between about 5 sccm to about 50 sccm (about 8% to about 4% of the plasma gas flow) and $CH_2F_2$ preferably between about 0.6 sccm to about 50 sccm (about 1% to about 4% of the plasma gas flow) are substantially selective to low-k material. In an embodiment, $CH_3F$ more preferably between about 7% to about 5% of the plasma gas flow and $CH_2F_2$ more preferably between about 2% to about 3% of the plasma gas flow are substantially selective to low-k material. In an embodiment, $CH_3F$ most preferably at about 4% of the plasma gas flow and $CH_2F_2$ most preferably at about 2.5% of the plasma gas flow are substantially selective to low-k material.

In an embodiment, the selectivity ratio of barrier material to low-k material for $CH_3F$ may be over 2.0. For example, a Lam Research 2300 Exelan Flex™ may be configured for etching a 300 mm substrate as described in FIGS. 2A-2J, with the following parameters:

| Pressure: | 200 mTorr |
|---|---|
| Power Range: | about 200 W to about 1000 W |
| Argon: | about 200 sccm to about 600 sccm |
| $CF_4$: | about 0 sccm to about 10 sccm |
| $O_2$: | about 5 sccm |
| CO: | about 0 sccm to about 200 sccm |
| Chuck Temperature: | about 0° to about 60° C. |
| Process Time | 30 seconds (depending on barrier film thickness and over etching preferred). |

Consequently, the measured selectivity at the center of the substrate of $CH_3F$ may be as follows:

|  | ISO | DENSE | S.R. (guard ring) |
|---|---|---|---|
| Coral ER low-k Material (A/min) | 640 | 607 | 673 |
| SiCN ER Barrier Material (A/min) | 1460 | 1360 | 1440 |
| SiCN/Coral Selectivity | 2.3 | 2.2 | 2.1 |

ISO generally refers to areas on the surface of the substrate in which features are isolated. DENSE generally refers to areas on the surface of the substrate in which features are densely populated. S.R. generally refers to a guard ring or trench around perimeter of the die.

The measured selectivity at the edge of the substrate of $CH_3F$ may be as follows:

|  | ISO | DENSE | S.R. (guard ring) |
|---|---|---|---|
| Coral ER low-k Material (A/mm) | 733 | 773 | 693 |
| SiCN ER Barrier Material (A/mm) | 1990 | 1800 | 1380 |
| SiCN/Coral Selectivity | 2.7 | 2.3 | 2.0 |

In an embodiment, the selectivity ratio of barrier material to low-k material for $CH_2F_2$ may be over 1.2. For example, a Lam Research 2300 Exelan Flex™ may be configured for etching a 300 mm substrate as described in FIGS. 2A-2J, with the following parameter:

| Pressure: | 120 mTorr |
|---|---|
| Power Range: | about 200 W to about 1000 W |
| Argon: | about 200 sccm |
| $CF_4$: | about 0 sccm to about 20 sccm |
| $O_2$: | about 10 sccm |
| $CH_2F_2$: | about 10 sccm |
| CO: | about 0 sccm to about 200 sccm |
| Chuck Temperature: | about 0° to about 60° C. |
| Process Time | 30 seconds (depending on barrier film thickness and over etching preferred). |

Consequently, the measured selectivity ratio at the center of the substrate of $CH_2F_2$ may be as follows:

|  | ISO | DENSE | S.R. |
|---|---|---|---|
| Coral ER low-k Material (A/min) | 765 | 885 | 885 |
| SiCN ER Barrier Material (A/min) | 1200 | 1200 | >1095 |
| SiCN/Coral Selectivity | 1.57 | 1.36 | >1.28 |

Consequently, highly selective process gases may allow the process window to be enlarged across a RF power and pressure range.

Figure 6:
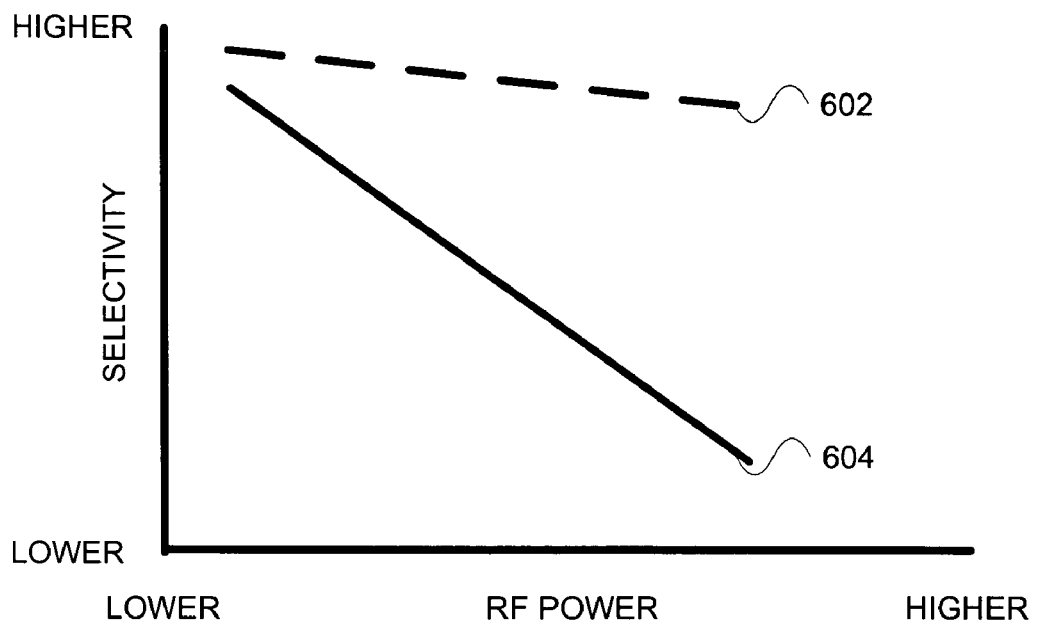
FIG. 6 shows a simplified diagram comparing the selectivity of barrier to low-k material of an optimized barrier etchant to the selectivity of a non-optimized barrier etchant, according to an embodiment of the invention.

Referring now to FIG. 6, a simplified diagram comparing the selectivity of barrier to low-k material of an optimized barrier etchant to the selectivity of a non-optimized barrier etchant is shown, according to an embodiment of the invention. In general, all other plasma process characteristics held constant, increasing RF power for a non-optimized barrier etchant reduces etch selectivity to low-k material since the etch process tends to be more physical (i.e., sputtering) and less chemical, as shown with plot 604. However, in an advantageous way, an optimized barrier etchant may allow a higher and more consistent level of selectivity to low-k material across a RF power range, as shown with plot 602.

Figure 7:
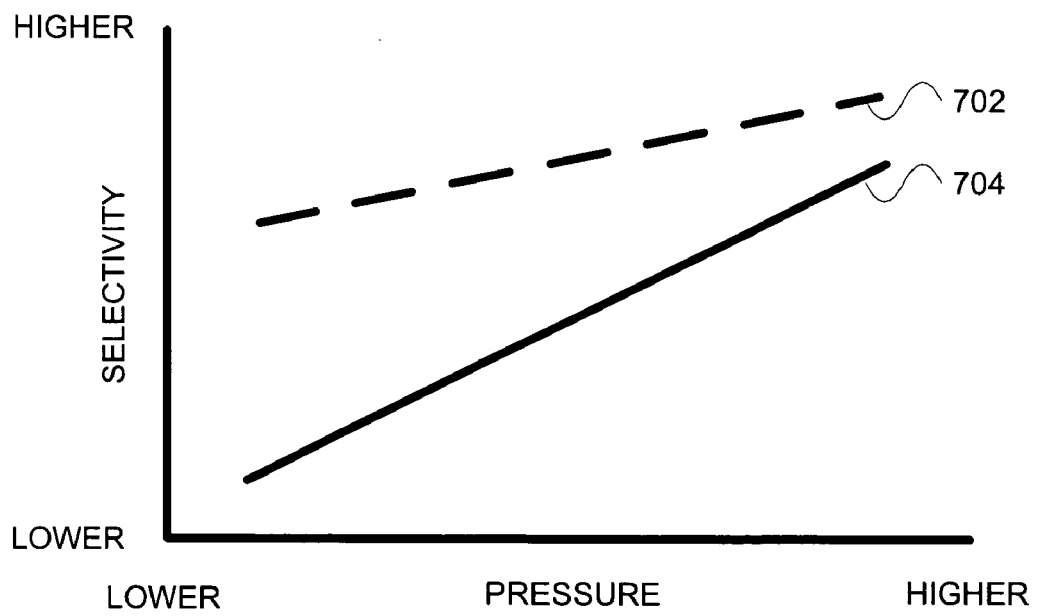
FIG. 7 shows a simplified diagram comparing selectivity to pressure in a plasma etch process, according to an embodiment of the invention.

Referring now to FIG. 7, a simplified diagram comparing selectivity to pressure in a plasma etch process is shown, according to an embodiment of the invention. In general, all other plasma process characteristics held constant, increasing pressure for a non-optimized barrier etchant tends to increase selectivity to low-k material, since the plasma, saturated with ions, has a smaller MFP. Since fewer ions are available to reach the substrate surface, the etch process tends to be less physical and more chemical, as shown with plot 704. However, in an advantageous way, an optimized barrier etchant may allow a higher and more consistent level of selectivity to low-k material across a pressure range, as shown with plot 702.

Figure 8:
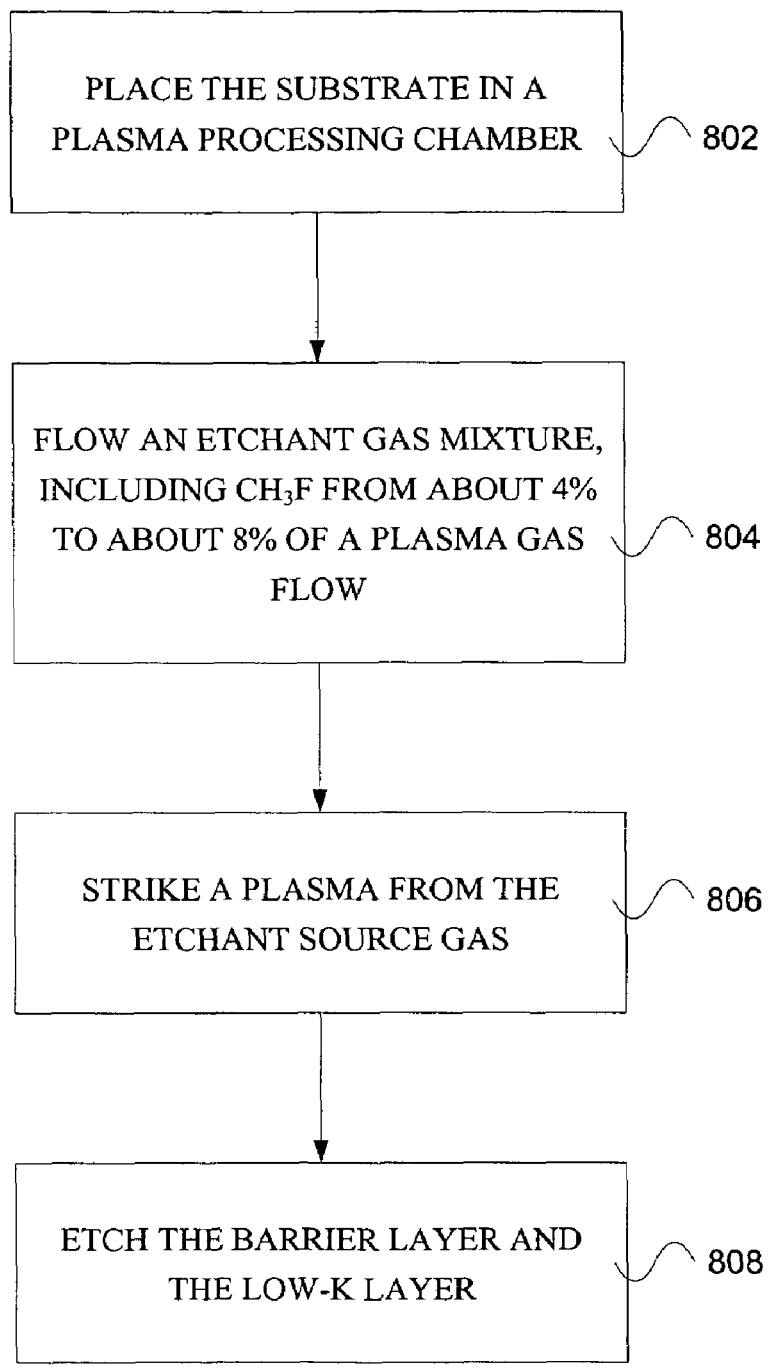
FIG. 8 shows a diagram showing a simplified method for etching a barrier material on a semiconductor substrate, according to an embodiment of the invention.

Referring now to FIG. 8, a diagram showing a simplified method for etching a barrier material on a semiconductor substrate, according to an embodiment of the invention. Generally, the substrate includes a barrier material and a low-k material, and wherein the barrier material and a low-k material are configured to be exposed to a plasma. Initially, at step 802, the substrate is placed in a plasma processing chamber of the plasma processing system. Next, at step 804, an etchant gas mixture is flowed, including $CH_3F$ from about 4% to about 8% of a plasma gas flow, into the plasma processing chamber. Generally, the etchant gas mixture is configured to etch the barrier material at a first etch rate, and the etchant gas mixture is configured to etch the low-k material at a second substantially lower etch rate. Next, at step 806, a plasma is struck. Finally, at step 808, the barrier layer and the low-k layer are eched.

While this invention has been described in terms of several preferred embodiments, there are alterations, permutations, and equivalents which fall within the scope of this invention. For example, although the present invention has been described in connection with plasma processing systems from Lam Research Corp. (e.g., Exelan™, Exelan™ HP, Exelan™ HPT, 2300™, Versys™ Star, etc.), other plasma processing systems may be used. This invention may also be used with substrates of various diameters (e.g., 200 mm, 300 mm, etc.). Also, photoresist plasma etchants comprising gases other than oxygen may be used. It should also be noted that there are many alternative ways of implementing the methods of the present invention.

Advantages of the invention include methods and apparatus for the optimization of highly selective process gases in order to etch a barrier layer. Additional advantages include widening the effective process window across an rf power and pressure range.

Having disclosed exemplary embodiments and the best mode, modifications and variations may be made to the disclosed embodiments while remaining within the subject and spirit of the invention as defined by the following claims.

What is claimed is:

1. In a plasma processing system, a method for etching a barrier material of a semiconductor substrate, said barrier material selected from the group consisting of SiCN, SiON, and $Si_3N_4$, the method comprising:

placing said semiconductor substrate in a plasma processing chamber of said plasma processing system, wherein said semiconductor substrate includes said barrier material and a low-k material, flowing an etchant gas mixture into said plasma processing chamber, wherein said etchant gas mixture comprises $CH_3F$, Ar, $CF_4$, $O_2$, and CO;

striking a plasma from said etchant gas mixture, said plasma etching said barrier material and said low-k material, wherein said plasma is configured to etch said barrier material at a first etch rate, said plasma is configured to etch said low-k material at a second etch rate, and said first etch rate is greater than said second etch rate.

2. The method of claim 1, wherein said $CH_3F$ is in a range from 5% to 7% of said etchant gas mixture.

3. The method of claim 1, wherein said $CH_3F$ is 6% of said etchant gas mixture.

4. The method of claim 1, wherein said etchant gas mixture includes $CH_2F_2$.

5. The method of claim 4, wherein said $CH_2F_2$ is in a range from 1% to 4% of said etchant gas mixture.

6. The method of claim 4, wherein said $CH_2F_2$ is in a range from 2% to 3% of said etchant gas mixture.

7. The method of claim 4, wherein said $CH_2F_2$ is 2.5% of said etchant gas mixture.

8. The method of claim 1 wherein the etchant gas mixture consists of $CH_3F$, Ar, $CF_4$, $O_2$, and CO.

9. In a capacitively-coupled plasma processing system, a method for etching a barrier material of a semiconductor substrate, said barrier material selected from the group consisting of SiCN, SiON, and $Si_3N_4$, the method comprising:

placing said semiconductor substrate in a plasma processing chamber of said plasma processing system, wherein said semiconductor substrate includes said barrier material and a low-k material, said low-k material representing one of Orthosilicate glass (OSG) and a Spin-On Dielectric (SOD);

flowing an etchant gas mixture into said plasma processing chamber, wherein said etchant gas mixture comprises $CH_3F$, Ar, $CF_4$, $O_2$, and CO; and striking a plasma from said etchant gas mixture, said plasma etching said barrier material and said low-k material at a chamber pressure between 40 m Torr and 200 m Torr, wherein said plasma is configured to etch said barrier material at a first etch rate, said plasma is configured to etch said low-k material at a second etch rate, and said first etch rate is greater than said second etch rate.

10. The method of claim 9, wherein said $CH_3F$ is in a range from 5% to 7% of said etchant gas mixture.

11. The method of claim 9, wherein said $CH_3F$ is 6% of said etchant gas mixture.

12. The method of claim 9, wherein said etchant gas mixture includes $CH_2F_2$.

13. The method of claim 12, wherein said $CH_2F_2$ is in a range from 1% to 4% of said etchant gas mixture.

14. The method of claim 12, wherein said $CH_2F_2$ is in a range from 2% to 3% of said etchant gas mixture.

15. The method of claim 12, wherein said $CH_2F_2$ is 2.5% of said etchant gas mixture.

16. The method of claim 12 wherein the etchant gas mixture consists of $CH_3F$, Ar, $CF_4$, $O_2$, and CO.

* * * * *